US010490621B1

(12) United States Patent
Thadesar et al.

(10) Patent No.: US 10,490,621 B1
(45) Date of Patent: Nov. 26, 2019

(54) CLOSE PROXIMITY TUNABLE INDUCTIVE ELEMENTS (71) Applicant: QUALCOMM Incorporated, San Diego, CA (US)

(72) Inventors: Paragkumar Ajaybhai Thadesar, San Diego, CA (US); Mario Francisco Velez, San Diego, CA (US); Changhan Hobie Yun, San Diego, CA (US); Francesco Carrara, San Diego, CA (US); Jonghae Kim, San Diego, CA (US); Xiaoju Yu, San Diego, CA (US); Niranjan Sunil Mudakatte, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/048,730

(22) Filed: Jul. 30, 2018

(51) Int. Cl.
*H01F 21/12* (2006.01)
*H01L 23/498* (2006.01)
*H01L 23/66* (2006.01)
*H01L 49/02* (2006.01)
*H01L 23/00* (2006.01)

(52) U.S. Cl.
CPC .............. *H01L 28/10* (2013.01); *H01F 21/12* (2013.01); *H01L 23/49822* (2013.01); *H01L 23/49838* (2013.01); *H01L 24/16* (2013.01); *H01L 23/66* (2013.01); *H01L 2223/6655* (2013.01); *H01L 2223/6672* (2013.01); *H01L 2224/13147* (2013.01); *H01L 2224/16225* (2013.01); *H01L 2924/1421* (2013.01); *H01L 2924/19011* (2013.01); *H01L 2924/19042* (2013.01); *H01L 2924/19051* (2013.01)

(58) Field of Classification Search
CPC ........... H01L 28/10; H01L 2924/19011; H01L 2924/19042; H05K 2201/1003
See application file for complete search history.

(56) References Cited

U.S. PATENT DOCUMENTS

| 6,081,030 A * | 6/2000 | Jaouen | H01L 23/48 257/531 |
| 8,237,269 B2 * | 8/2012 | Tang | H01L 23/48 257/734 |
| 8,717,118 B2 * | 5/2014 | Kim | H01L 23/5227 333/33 |

* cited by examiner

*Primary Examiner* — Robert G Bachner
*Assistant Examiner* — Molly K Reida
(74) *Attorney, Agent, or Firm* — Patterson & Sheridan, L.L.P (57) ABSTRACT Apparatus implementing various structures to decrease the distance between two inductive elements for tuning an inductance with greater variability (a wider tuning range). One example integrated circuit (IC) package generally includes a laminate, a solder resist layer disposed on an upper surface of the laminate, and a semiconductor die disposed above the laminate and comprising a first inductor. At least a portion of a second inductor is disposed above a section of the solder resist layer, the first inductor at least partially overlaps the second inductor, and there is a gap between the first inductor and the second inductor.

10 Claims, 7 Drawing Sheets

CLOSE PROXIMITY TUNABLE INDUCTIVE ELEMENTS

FIELD OF THE DISCLOSURE

Certain aspects of the present disclosure generally relate to electronic circuits and, more particularly, to tunable inductive elements with close proximity.

DESCRIPTION OF RELATED ART

Wireless communication networks are widely deployed to provide various communication services such as telephony, video, data, messaging, broadcasts, and so on. Such networks, which are usually multiple access networks, support communications for multiple users by sharing the available network resources. A wireless communication network may include a number of base stations that can support communication for a number of user equipments. A user equipment (UE) may communicate with a base station (BS) via a downlink and an uplink. The UE and/or BS may include a radio frequency front-end (RFFE) for transmitting and/or receiving radio frequency (RF) signals, and the RFFE may include various inductive elements.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include an improved RF front-end having online tunable inductive elements.

Certain aspects of the present disclosure provide an integrated circuit (IC) package. The IC package generally includes a laminate; a solder resist layer disposed on an upper surface of the laminate; and a semiconductor die disposed above the laminate and comprising a first inductor, wherein at least a portion of a second inductor is disposed above a section of the solder resist layer, wherein the first inductor at least partially overlaps the second inductor, and wherein there is a gap between the first inductor and the second inductor.

Certain aspects of the present disclosure provide an IC package. The IC package generally includes a laminate having a first inductor and a plurality of trenches in an upper surface of the laminate; a semiconductor die disposed above the laminate and comprising a second inductor at least partially overlapping the first inductor; and a plurality of electrical conductors disposed between the laminate and the semiconductor die and configured to electrically couple at least one metal layer of the laminate to at least one metal layer of the semiconductor die, wherein the plurality of electrical conductors are partially disposed in the plurality of trenches of the laminate and wherein the plurality of electrical conductors are electrically connected to an inner metal layer of the laminate.

Certain aspects of the present disclosure provide a laminate. The laminate generally includes a first inductor having one or more traces disposed in a first metal layer of the laminate; a second inductor having one or more traces disposed in a second metal layer of the laminate, wherein the first inductor at least partially overlaps the second inductor; and a first switch coupled between a first end of the second inductor and a reference node, for tuning the second inductor.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure provide tunable inductive elements, which may be capable of being tuned online (i.e., during operation) at radio frequencies. Certain aspects implement a tunable inductive element using an on-die inductive element in close proximity with an on-laminate inductive element. The close proximity may be achieved using structural aspects at the integrated circuit (IC) package level.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS).

New Radio (NR) is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

NR access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

Example Wireless Communication System

Figure 1:
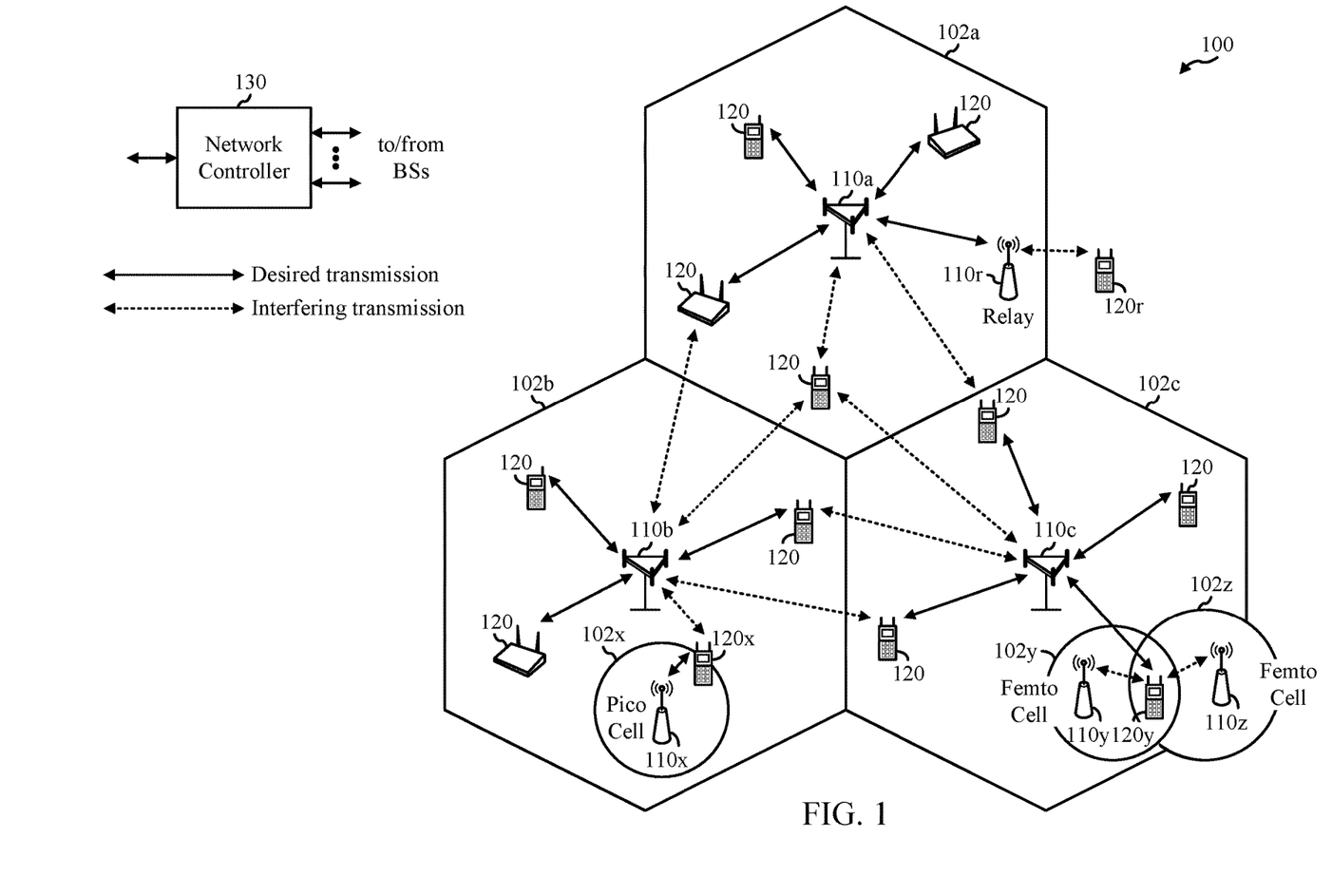
FIG. 1 is a block diagram conceptually illustrating an example telecommunications system, in accordance with certain aspects of the present disclosure.

FIG. 1 illustrates an example wireless communication network 100 in which aspects of the present disclosure may be performed. For example, the wireless communication network 100 may be a New Radio (NR) or 5G network. Wireless devices in the wireless network 100 may be equipped with tunable inductive elements described herein.

As illustrated in FIG. 1, the wireless network 100 may include a number of base stations (BSs) 110 and other network entities. A BS may be a station that communicates with user equipments (UEs). Each BS 110 may provide communication coverage for a particular geographic area. In 3GPP, the term "cell" can refer to a coverage area of a Node B (NB) and/or a Node B subsystem serving this coverage area, depending on the context in which the term is used. In NR systems, the term "cell" and next generation Node B (gNB), new radio base station (NR BS), 5G NB, access point (AP), or transmission reception point (TRP) may be interchangeable. In some examples, a cell may not necessarily be stationary, and the geographic area of the cell may move according to the location of a mobile BS. In some examples, the base stations may be interconnected to one another and/or to one or more other base stations or network nodes (not shown) in wireless communication network 100 through various types of backhaul interfaces, such as a direct physical connection, a wireless connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A base station (BS) may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

Wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, a macro BS may have a high transmit power level (e.g., 20 watts (W)) whereas a pico BS, a femto BS, and relays may have a lower transmit power level (e.g., 1 W).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120x, 120y, etc.) may be dispersed throughout the wireless network 100, and each UE may be stationary or mobile. A UE may also be referred to as a mobile station (MS), a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a Global Positioning System (GPS) device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz, and the minimum resource allocation (called a "resource block" (RB)) may be 12 subcarriers (or 180 kHz). Consequently, the nominal Fast Fourier Transfer (FFT) size may be equal to 128, 256, 512, 1024 or 2048 for a system bandwidth of 1.25, 2.5, 5, 10, or 20 megahertz (MHz), respectively. The system bandwidth may also be partitioned into subbands. For example, a subband may cover 1.08 MHz (i.e., 6 resource blocks), and there may be 1, 2, 4, 8, or 16 subbands for a system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a cyclic prefix (CP) on the uplink and downlink and include support for half-duplex operation using time-division duplexing (TDD). Beamforming may be supported, and beam direction may be dynamically configured. Multiple-input, multiple-output (MIMO) transmissions with precoding may also be supported. MIMO configurations in the downlink (DL) may support up to 8 transmit antennas with multi-layer DL transmissions up to 8 streams and up to 2 streams per UE. Aggregation of multiple cells may be supported with up to 8 serving cells.

In some examples, access to the air interface may be scheduled, wherein a scheduling entity (e.g., a base station) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Figure 2:
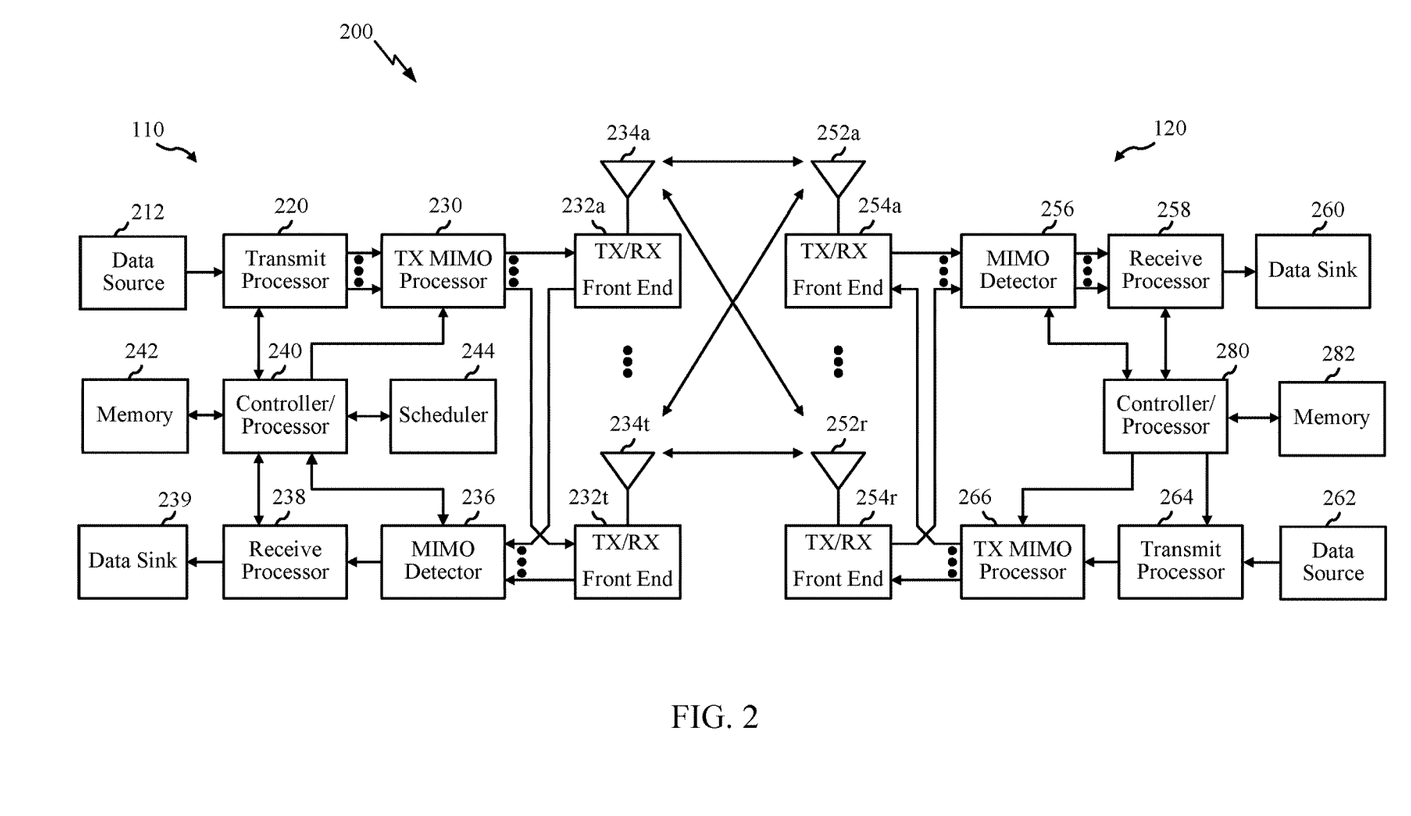
FIG. 2 is a block diagram conceptually illustrating a design of an example base station (BS) and an example user equipment (UE), in accordance with certain aspects of the present disclosure.

FIG. 2 illustrates example components of BS 110 and UE 120 (as depicted in FIG. 1), which may be used to implement aspects of the present disclosure. For example, antennas 252, processors 266, 258, 264, and/or controller/processor 280 of the UE 120 and/or antennas 234, processors 220, 240, 238, and/or controller/processor 240 of the BS 110 may be used to perform the various techniques and methods described herein.

At the BS 110, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. The processor 220 may process (e.g., encode and symbol map) the data and control information to obtain data symbols and control symbols, respectively. The processor 220 may also generate reference symbols, e.g., for the primary synchronization signal (PSS), secondary synchronization signal (SSS), and cell-specific reference signal (CRS). A transmit (TX) multiple-input multiple-output (MIMO) processor 230 may perform spatial processing (e.g., precoding) on the data symbols, the control symbols, and/or the reference symbols, if applicable, and may provide output symbol streams to the transmit (TX) front-end circuits 232a through 232t. Each TX front-end circuit 232 may process a respective output symbol stream (e.g., for OFDM, etc.) to obtain an output sample stream. Each TX front-end circuit may further process (e.g., convert to analog, amplify, filter, and upconvert) the output sample stream to obtain a downlink signal. Downlink signals from TX front-end circuits 232a through 232t may be transmitted via the antennas 234a through 234t, respectively.

At the UE 120, the antennas 252a through 252r may receive the downlink signals from the BS 110 and may provide received signals to the receive (RX) front-end circuits 254a through 254r, respectively. Each RX front-end circuit 254 may condition (e.g., filter, amplify, downconvert, and digitize) a respective received signal to obtain input samples. Each RX front-end circuit may further process the input samples (e.g., for OFDM, etc.) to obtain received symbols. A MIMO detector 256 may obtain received symbols from all the RX front-end circuits 254a through 254r, perform MIMO detection on the received symbols if applicable, and provide detected symbols. A receive processor 258 may process (e.g., demodulate, deinterleave, and decode) the detected symbols, provide decoded data for the UE 120 to a data sink 260, and provide decoded control information to a controller/processor 280.

On the uplink, at UE 120, a transmit processor 264 may receive and process data (e.g., for the physical uplink shared channel (PUSCH)) from a data source 262 and control information (e.g., for the physical uplink control channel (PUCCH) from the controller/processor 280. The transmit processor 264 may also generate reference symbols for a reference signal (e.g., for the sounding reference signal (SRS)). The symbols from the transmit processor 264 may be precoded by a TX MIMO processor 266 if applicable, further processed by the RX front-end circuits 254a through 254r (e.g., for SC-FDM, etc.), and transmitted to the BS 110. At the BS 110, the uplink signals from the UE 120 may be received by the antennas 234, processed by the TX front-end circuits 232, detected by a MIMO detector 236 if applicable, and further processed by a receive processor 238 to obtain decoded data and control information sent by the UE 120. The receive processor 238 may provide the decoded data to a data sink 239 and the decoded control information to the controller/processor 240.

The controllers/processors 240 and 280 may direct the operation at the BS 110 and the UE 120, respectively. The processor 240 and/or other processors and modules at the BS 110 may perform or direct the execution of processes for the techniques described herein. The memories 242 and 282 may store data and program codes for BS 110 and UE 120, respectively. A scheduler 244 may schedule UEs for data transmission on the downlink and/or uplink. In certain aspects, the TX/RX front-end circuits 232, 254 may include tunable inductive elements as further described herein.

Figure 3:
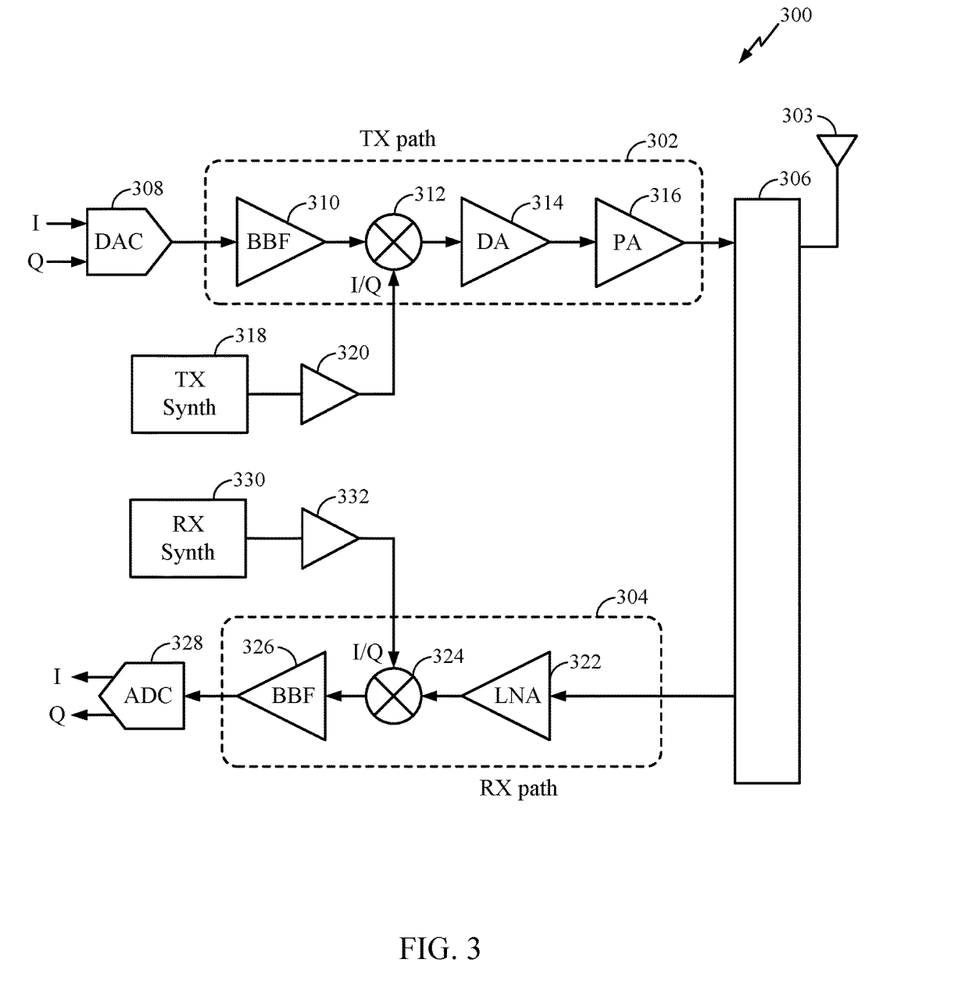
FIG. 3 is a block diagram showing an example transceiver front-end, in accordance with certain aspects of the present disclosure.

FIG. 3 is a block diagram of an example transceiver front-end 300, such as TX/RX front-end circuits 232, 254 in FIG. 2, in which aspects of the present disclosure may be practiced. The transceiver front-end 300 includes at least one transmit (TX) path 302 (also known as a transmit chain) for transmitting signals via one or more antennas and at least one receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be included in the RFIC or external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 may include a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects provided herein can be employed in any of various other suitable systems where tunable inductive elements are desired.

Example Tunable Inductive Elements

Certain RF modules, such as a transceiver front-end for 5G wireless applications, may have limited tuning capabilities. For example, the RF modules may only have tunable capacitive elements, such as a binary weighted capacitive array, without any capability of tuning inductive elements. This severely limits the tolerances of the RF module, as well as the operating frequencies. As a result, certain RF modules for 5G wireless applications may only be operable for a single 5G band and/or offer a narrow tuning range. Online tunable inductive elements, as further described herein, enable RF modules to operate in different frequency bands of the 5G spectrum and/or enable a wider tuning range (e.g., inductance), thereby tolerating a wider variation in components in the RF module(s).

Figure 4:
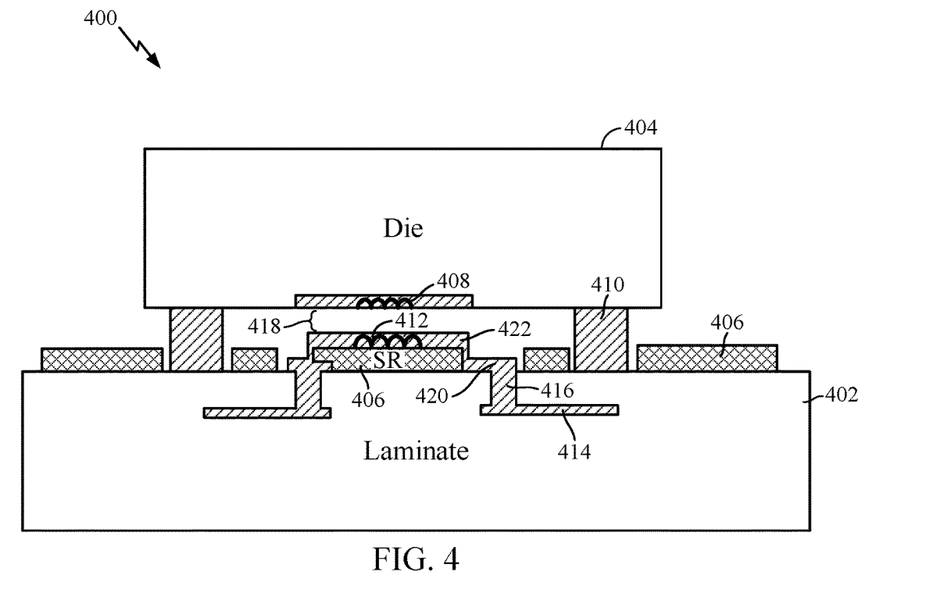
FIG. 4 is a cross-sectional view of an example integrated circuit package, in accordance with certain aspects of the present disclosure.

FIG. 4 is a cross-sectional view of an example integrated circuit (IC) package 400, in accordance with certain aspects of the present disclosure. As shown, the IC package 400 includes a laminate 402, a semiconductor die 404, and a solder resist layer 406. The IC package 400 may include a TX/RX front-end circuit having passive elements (e.g., BBF 310, 326) and/or active elements (e.g., PA 316, LNA 322, DAC 308, or ADC 328). For example, the semiconductor die 404 may include an RF amplifier, and the laminate 402 may include the passive elements (e.g., resistors, capacitors, and/or inductors, such as in RF filters, chokes, or impedance matching circuits) that couple to the semiconductor die 404 to form at least part of the TX/RX front-end circuit.

The semiconductor die 404 may be a single piece of semiconductor having an IC. For example, the semiconductor die 404 may be implemented as a flip-chip die having a first inductor 408 as illustrated in FIG. 4. The semiconductor die 404 may implement any suitable semiconductor device, including but not limited to a PA, an LNA, a DAC, an ADC, a filter, or combination thereof. The semiconductor die 404 is disposed above the laminate 402 and coupled to the laminate 402 via electrical conductors 410. The electrical conductors 410 may be, for example, solder bumps or conductive pillars (e.g., copper (Cu) pillars) that extend from the semiconductor die 404 and couple to an inner metal layer (not shown). In this example, the electrical conductors 410 are coupled to an upper surface of the laminate 402 having a metal layer (shown as part of the electrical conductors 410, but included in metal layer 420) thereon.

The laminate 402 may be implemented as a stack of thin substrate layers. That is, the laminate 402 may have two or more metal layers 414, 420 interspersed by one or more dielectric layers. The laminate 402 may be a package substrate, a laminate substrate, an interposer substrate, a printed circuit board (PCB) substrate, low temperature co-fired ceramic (LTCC) substrate, high temperature co-fired ceramic (HTCC) substrate, or any other suitable multilayer structure. The metal layers 414, 420 may be metal planes or traces that are interconnected to each other by through-hole plated vias 416.

The solder resist layer 406 may be disposed on an upper surface of the laminate 402. At least a portion of a second inductor 412 may be disposed above a section of the solder resist layer 406. The first inductor 408 is arranged above and at least partially overlaps the second inductor 412, such that there is a gap 418 between the first inductor 408 and the second inductor 412. The gap 418 may be filled with a resin to provide an additional bond between the semiconductor die 404 and the laminate 402.

The upper surface of the laminate 402 may include a metal layer 420. Traces 422 of the metal layer 420 may be connected to the at least the portion of the second inductor 412 via metallization disposed adjacent one or more lateral surfaces of the section of the solder resist layer 406.

The second inductor 412 may be positioned to operably couple with the first inductor 408. For example, the second inductor 412 may magnetically couple with the first inductor 408 while a time-varying electrical current is applied to the first inductor 408. The second inductor 412 may be a tunable inductor, as further described herein, which may enable the adjustment of the inductance of the first inductor 408. This may enable an RF front-end circuit to operate at different bands, vary the operating parameters of the semiconductor die 404, and/or tolerate wider variation in components of the RF front-end circuit. The laminate 402 and/or the semiconductor die 404 may also include switches (not shown) that are coupled to the second inductor 412 and enable the modification of the inductance of the first inductor 408 as further described herein.

Figure 5:
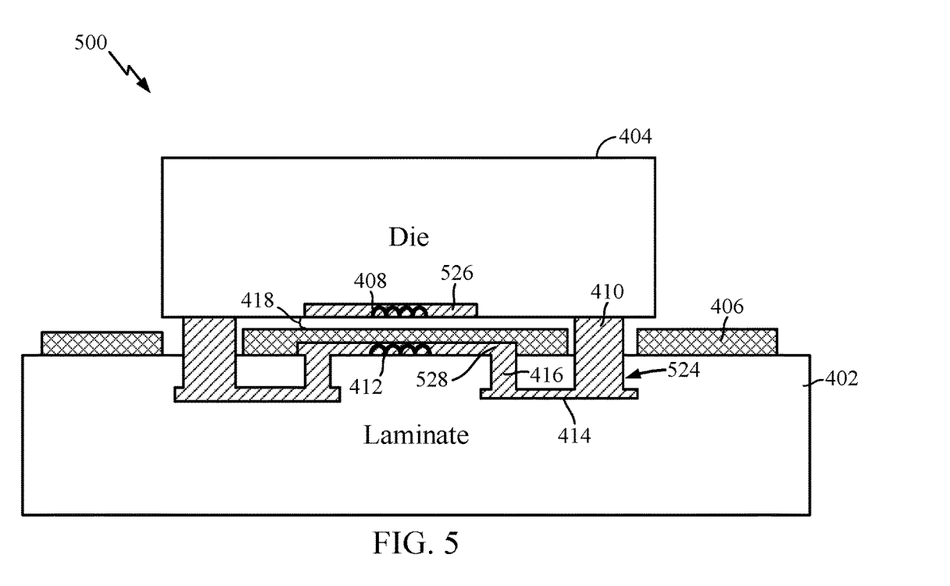
FIG. 5 is a cross-section view of another example integrated circuit package, in accordance with certain aspects of the present disclosure.

In certain aspects, the bumps or conductive pillars of the semiconductor die may be arranged inside trenches of the laminate. For example, FIG. 5 is a cross-sectional view of another example IC package 500, in accordance with certain aspects of the present disclosure. As shown, the semiconductor die 404 is arranged to couple with an inner metal layer 414 (or, more specifically, one or more inner traces) of the laminate 402. The electrical conductors 410 may be partially disposed in trenches 524 of the laminate 402 and coupled to the inner metal layer 414, such that the electrical conductors 410 support the semiconductor die 404 above the laminate 402, but still maintain a gap 418. The inner metal layer 414 may be arranged adjacent to an upper metal layer 528 of the laminate 402. The electrical conductors 410 may electrically couple at least the inner metal layer 414 of the laminate 402 to at least one metal layer (e.g., bottom metal layer 526) of the semiconductor die 404. The trenches 524 of the laminate 402 may be formed by drilling or etching away a portion of the laminate 402.

For certain aspects, the second inductor 412 may be disposed in an upper metal layer 528 of the laminate 402 and covered by a section of the solder resist layer 406. In other aspects, the second inductor 412 may be arranged on the solder resist layer 406 as depicted in FIG. 4. The first inductor 408 may be disposed in the bottom metal layer 526 of the semiconductor die 404.

Arranging the electrical conductors 410 of the semiconductor die 404 in trenches 524 of the laminate 402 enables the first inductor 408 to be positioned closer to the second inductor 412, which in turn enables a stronger magnetic coupling between the first and second inductors 408, 412 compared to conventional designs. A stronger magnetic coupling between the first and second inductors 408, 412 may enable greater flexibility in tuning the inductance of the first inductor 408. For example, the tunable second inductor 412 may provide a wider range of the inductance of the first inductor 408. The laminate 402 and/or the semiconductor die 404 may also include switches (not shown) that are coupled to the second inductor 412 and enable the modification of the inductance of the first inductor 408 as further described herein.

Figure 6:
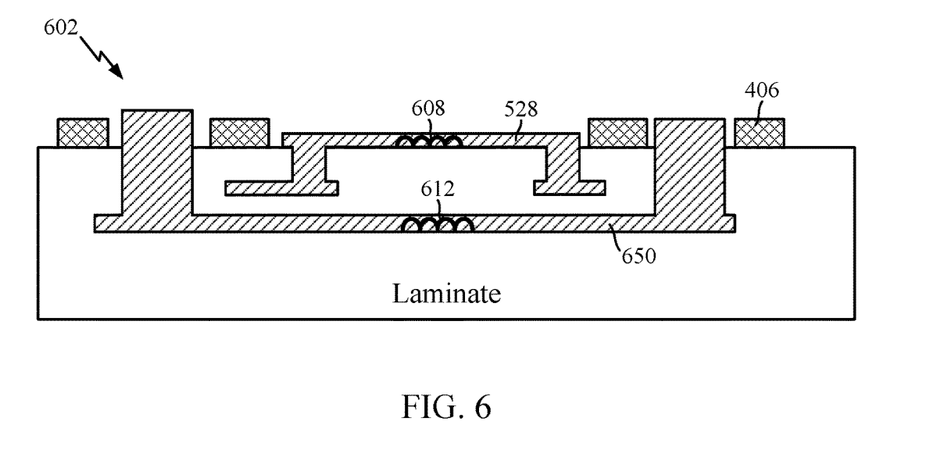
FIG. 6 is a cross-sectional view of yet another example integrated circuit package, in accordance with certain aspects of the present disclosure.

For certain aspects, the inductors of the IC package may be arranged on the same laminate. For example, FIG. 6 is a cross-sectional view of an example laminate 602, in accordance with certain aspects of the present disclosure. As shown, the laminate 602 includes a first inductor 608 and a second inductor 612. The first inductor 608 may be arranged on a different layer than the second inductor 612, but at least partially overlaps the second inductor. As shown, the first inductor 608 is disposed in the metal layer 528 on the upper surface of the laminate 602, and the second inductor 612 is disposed below the first inductor 608 in an inner metal layer 650 of the laminate 602. The laminate 602 may also include switches (not shown) that enable the modification of the inductance of the first inductor 608 as further described herein.

Figure 7:
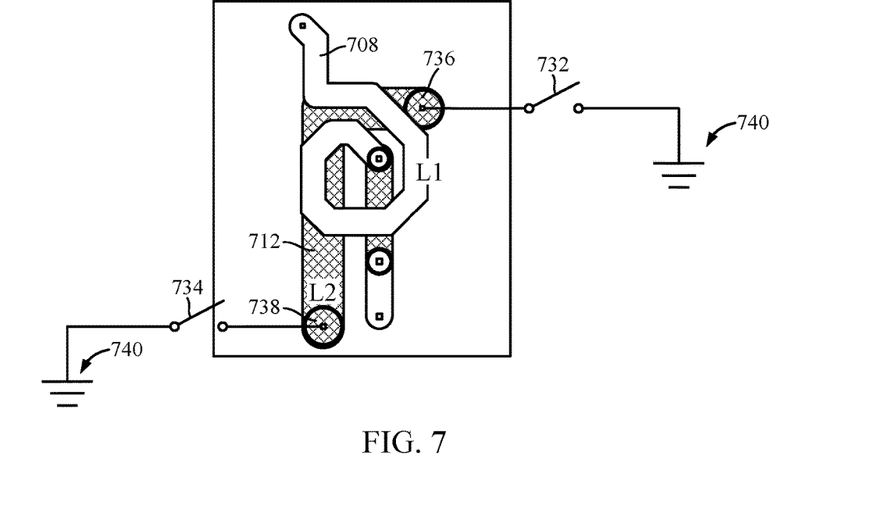
FIG. 7 is an example layout of inductors, in accordance with certain aspects of the present disclosure.

FIG. 7 is an example layout of inductors, in accordance with certain aspects of the present disclosure. As shown, a first inductor 708 may be arranged above a second inductor 712. The first and second inductors 708, 712 may be arranged on a semiconductor die, a laminate, or one of each. As examples, the inductors 708, 712 may be arranged as shown in FIGS. 4-6 with regard to the first and second inductors 408, 412, 608, and 612. The second inductor 712 may be a tunable inductor having a first switch 732 coupled between a first end 736 of the second inductor and a reference node 740 (e.g., a common ground or reference voltage) and a second switch 734 coupled between a second end 739 of the second inductor 712 and the reference node 740. For certain aspects, the first switch 732 and/or the second switch 734 may be disposed in a semiconductor die (e.g., the semiconductor die 404) and coupled to at least one control line disposed in the semiconductor die. This enables the semiconductor die to control the state of the tunable inductor on the laminate. In this case, the first end 736 and/or the second end 739 of the second inductor 712 may be electrically coupled to the first switch 732 and/or the second switch 734, respectively, via one or more of the electrical conductors 410.

The switches 732, 734 provide three tunable states for the second inductor 712: a first state where both switches 732, 734 are open, a second state where one of the switches 732, 734 is open, and a third state where both switches 732, 734 are closed. For each state, the second inductor 712 may influence the inductance of the first inductor 708. For example, the inductance of the first inductor 708 at the first state may be greater than the inductance of the first inductor 708 at the second and third states, and the inductance of the first inductor 708 at the second state may be greater than the inductance of the first inductor at the third state.

Figure 8A:
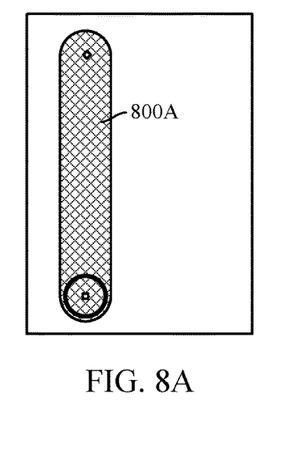
FIG. 8A illustrates an example straight inductor, in accordance with certain aspects of the present disclosure.
Figure 8B:
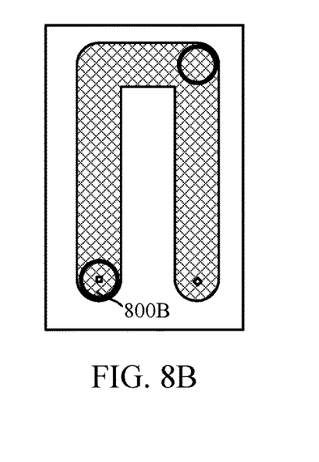
FIG. 8B illustrates an example U-shaped inductor, in accordance with certain aspects of the present disclosure.
Figure 8C:
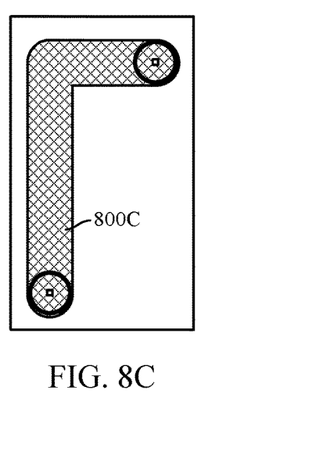
FIG. 8C illustrates an example L-shaped inductor, in accordance with certain aspects of the present disclosure.

The inductors, described herein, may take various forms, including but not limited to a coil (inductor 708), an L-shape (inductor 712), a straight trace, or a U-shape. For example, FIG. 8A shows an inductor 800A implemented as a straight trace, in accordance with certain aspects of the present disclosure. As an example, FIG. 8B shows an inductor 800B formed in a U-shape, in accordance with certain aspects of the present disclosure. As another example, FIG. 8C shows an inductor 800C formed in an L-shape, in accordance with certain aspects of the present disclosure.

Figure 9:
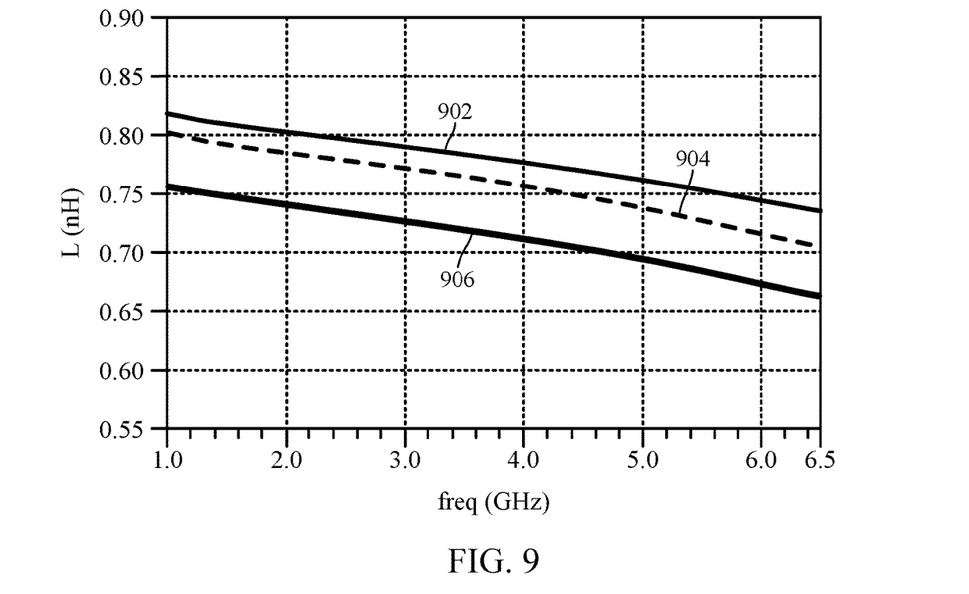
FIG. 9 is an example graph illustrating inductance versus frequency of an example inductor, in accordance with certain aspects of the present disclosure.

FIG. 9 is an example graph illustrating the inductance of an inductor arranged above a tunable inductor (e.g., inductor 712), in accordance with certain aspects of the present disclosure. As shown, the graph includes curves 902, 904, 906 representing the inductance (in nanohenries (nH)) as a function of frequency (in GHz). The curve 902 represents the spectral inductance in the state where both switches of the tunable inductor are open (i.e., effectively a standalone inductor, without the effects of the tunable inductor). The curve 904 represents the spectral inductance in the state where one of the switches of the tunable inductor is open. The curve 906 represents the spectral inductance in the state where both switches of the tunable inductor are closed. As shown, each of the states of the tunable inductor provide a different spectral inductance exhibited by the inductor arranged above the tunable inductor. This enables the inductance of the upper inductor to be tuned, thereby facilitating an RF module to operate in different frequency bands and/or tolerate wider variation in components of the RF module.

Figure 10:
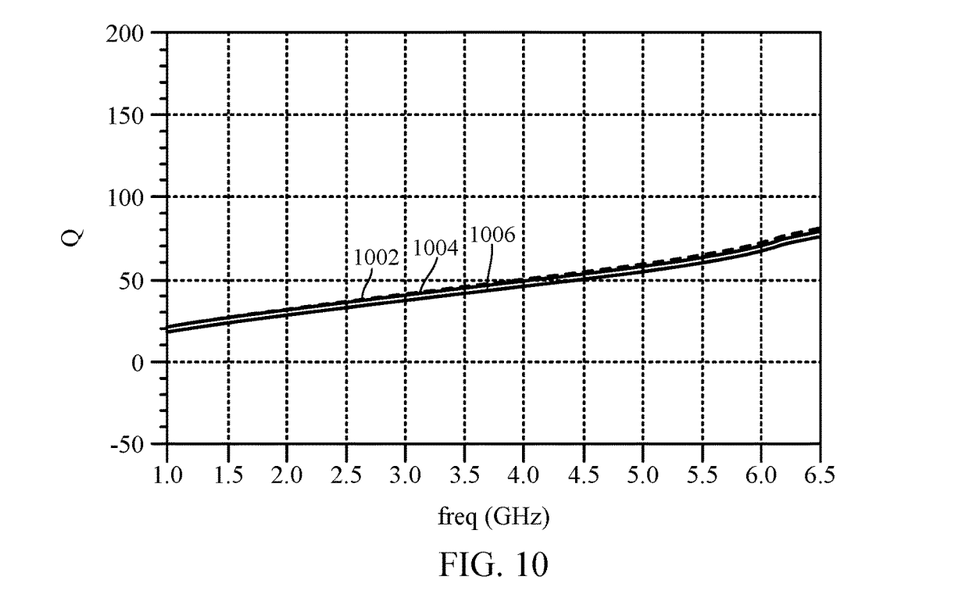
FIG. 10 is an example graph illustrating quality factor (Q) versus frequency of an example inductor, in accordance with certain aspects of the present disclosure.

FIG. 10 is an example graph illustrating the quality factor (Q) of the inductor arranged above a tunable inductor (e.g., inductor 712), in accordance with certain aspects of the present disclosure. As shown, the graph includes curves 1002, 1004, 1006 corresponding to the tunable inductor states of curves 902, 904, 906, respectively. The curves 1002, 1004, 1006 demonstrate that the Q of the inductor is not impacted, despite the changes in inductance provided by different switch states.

Certain aspects of the present disclosure provide an IC package. The IC package generally includes a laminate; a solder resist layer disposed on an upper surface of the laminate; and a semiconductor die disposed above the laminate and comprising a first inductor, wherein at least a portion of a second inductor is disposed above a section of the solder resist layer, wherein the first inductor at least partially overlaps the second inductor, and wherein there is a gap between the first inductor and the second inductor.

According to certain aspects, the second inductor is a tunable inductor. For certain aspects, the IC package further includes a first switch coupled between a first end of the second inductor and a reference node and/or a second switch coupled between a second end of the second inductor and the reference node. For certain aspects, at least one of the first switch or the second switch is disposed in the semiconductor die and is coupled to at least one control line disposed in the semiconductor die.

According to certain aspects, the upper surface of the laminate comprises a metal layer. For certain aspects, traces of the metal layer are connected to the at least the portion of the second inductor via metallization disposed adjacent one or more lateral surfaces of the section of the solder resist layer.

According to certain aspects, the semiconductor die is or includes a flip-chip die. For certain aspects, a plurality of electrical conductors connect one or more metal layers of the semiconductor die to one or more metal layers of the laminate. In this case, the plurality of electrical conductors may support the semiconductor die above the laminate.

According to certain aspects, the laminate comprises two or more metal layers interspersed by one or more dielectric layers.

According to certain aspects, the semiconductor die comprises a radio frequency (RF) amplifier, and the laminate comprises an RF filter.

Certain aspects of the present disclosure provide an IC package. The IC package generally includes a laminate having a first inductor and a plurality of trenches in an upper surface of the laminate; a semiconductor die disposed above the laminate and comprising a second inductor at least partially overlapping the first inductor; and a plurality of electrical conductors disposed between the laminate and the semiconductor die and configured to electrically couple at least one metal layer of the laminate to at least one metal layer of the semiconductor die, wherein the plurality of electrical conductors are partially disposed in the plurality of trenches of the laminate and wherein the plurality of electrical conductors are electrically connected to an inner metal layer of the laminate.

According to certain aspects, the first inductor is disposed in an upper metal layer of the laminate. In this case, the inner metal layer may be adjacent to the upper metal layer. For certain aspects, the laminate comprises at least one other metal layer disposed between the inner metal layer and the upper metal layer.

According to certain aspects, the first inductor is a tunable inductor. For certain aspects, the IC package further includes a first switch coupled between a first end of the first inductor and a reference node and/or a second switch coupled between a second end of the first inductor and the reference node. For certain aspects, at least one of the first switch or the second switch is disposed in the semiconductor die and is coupled to at least one control line disposed in the semiconductor die.

According to certain aspects, the semiconductor die comprises a flip-chip die. In this case, the plurality of electrical conductors may support the semiconductor die above the laminate. For certain aspects, the second inductor is disposed in a bottom metal layer of the flip-chip die.

According to certain aspects, the laminate is composed of two or more metal layers interspersed by one or more dielectric layers.

According to certain aspects, the plurality of electrical conductors comprise at least one of copper (Cu) pillars or solder bumps.

According to certain aspects, the IC package further includes a solder resist layer disposed above the upper surface of the laminate.

Certain aspects of the present disclosure provide a laminate. The laminate generally includes a first inductor having one or more traces disposed in a first metal layer of the laminate; a second inductor having one or more traces disposed in a second metal layer of the laminate, wherein the first inductor at least partially overlaps the second inductor; and a first switch coupled between a first end of the second inductor and a reference node, for tuning the second inductor.

According to certain aspects, the laminate further includes a second switch coupled between a second end of the second inductor and the reference node, for tuning the second inductor.

It should be appreciated that the tunable inductor arrangement described herein enables an RF front-end to modify the inductance of an inductor disposed in a semiconductor die or laminate. This enables the RF front-end as described herein to operate at different frequencies and/or tolerate a wider variation in components even while the RF front-end is online (e.g., during operation).

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An integrated circuit (IC) package comprising:
   a laminate;
   a solder resist layer disposed on an upper surface of the laminate; and
   a semiconductor die disposed above the laminate and comprising a first inductor, wherein at least a portion of a second inductor is disposed above a section of the solder resist layer, wherein the first inductor at least partially overlaps the second inductor, and wherein there is a gap between the first inductor and the second inductor.

2. The IC package of claim 1, wherein the second inductor is a tunable inductor.

3. The IC package of claim 2, further comprising a first switch coupled between a first end of the second inductor and a reference node.

4. The IC package of claim 3, further comprising a second switch coupled between a second end of the second inductor and the reference node.

5. The IC package of claim 4, wherein at least one of the first switch or the second switch is disposed in the semiconductor die and is coupled to at least one control line disposed in the semiconductor die.

6. The IC package of claim 1, wherein the upper surface of the laminate comprises a metal layer and wherein traces of the metal layer are connected to the at least the portion of the second inductor via metallization disposed adjacent one or more lateral surfaces of the section of the solder resist layer.

7. The IC package of claim 1, wherein the semiconductor die comprises a flip-chip die, wherein a plurality of electrical conductors connect one or more metal layers of the semiconductor die to one or more metal layers of the laminate, and wherein the plurality of electrical conductors support the semiconductor die above the laminate.

8. The IC package of claim 1, wherein the laminate comprises two or more metal layers interspersed by one or more dielectric layers.

9. The IC package of claim 1, wherein the first inductor is configured to magnetically couple with the second inductor.

10. The IC package of claim 4, wherein the second inductor is configured to adjust an inductance of the first inductor based on a state of the first switch and the second switch.

\* \* \* \* \*